(12) United States Patent
Hubing et al.

(10) Patent No.: US 8,743,529 B2
(45) Date of Patent: Jun. 3, 2014

(54) CAPACITIVE-STEMMED CAPACITOR

(75) Inventors: Todd Hubing, Clemson, SC (US);
Hocheol Kwak, Central, SC (US);
Haixin Ke, Clemson, SC (US)

(73) Assignee: Clemson University Research Foundation, Clemson, SC (US)

( * ) Notice: Subject to any disclaimer, the term of this patent is extended or adjusted under 35 U.S.C. 154(b) by 133 days.

(21) Appl. No.: 13/143,637

(22) PCT Filed: Jan. 6, 2010

(86) PCT No.: PCT/US2010/020195
§ 371 (c)(1),
(2), (4) Date: Sep. 1, 2011

(87) PCT Pub. No.: WO2010/080786
PCT Pub. Date: Jul. 15, 2010

(65) Prior Publication Data
US 2011/0304949 A1   Dec. 15, 2011

Related U.S. Application Data

(60) Provisional application No. 61/143,581, filed on Jan. 9, 2009.

(51) Int. Cl.
*H01G 4/228*   (2006.01)

(52) U.S. Cl.
USPC .......... 361/306.2; 361/306.1; 361/306.3; 361/303; 361/305; 361/312

(58) Field of Classification Search
USPC .......... 361/306.2, 306.1, 321.2, 303–305, 361/311–313
See application file for complete search history.

(56) References Cited

U.S. PATENT DOCUMENTS

| | | | | |
|---|---|---|---|---|
| 6,571,184 | B2 * | 5/2003 | Anderson et al. | 702/65 |
| 6,713,860 | B2 * | 3/2004 | Li | 257/700 |
| 6,829,133 | B2 * | 12/2004 | Wermer et al. | 361/302 |
| 8,045,319 | B2 * | 10/2011 | Ritter et al. | 361/303 |
| 8,125,761 | B2 * | 2/2012 | Hsu et al. | 361/306.1 |

\* cited by examiner

*Primary Examiner* — Nguyen T Ha
(74) *Attorney, Agent, or Firm* — Ballard Spahr LLP

(57) ABSTRACT

A capacitor having a stem that is designed to be inserted into a single, large-diameter via hole drilled in a printed circuit board is provided, wherein the stem may have conductive rings for making the positive and negative connections to the printed circuit board power distribution planes. Inside the capacitive stem, current, or at least a portion thereof, may be carried to the main body of the capacitor through low-inductance plates that are interleaved to maximize their own mutual inductance and, therefore, minimize the connection inductance. Alternatively, the capacitor may include a coaxial stem that forms a coaxial transmission line with the anode and cathode terminals forming the inner and outer conductors.

17 Claims, 10 Drawing Sheets

US 8,743,529 B2

CAPACITIVE-STEMMED CAPACITOR

FIELD

Embodiments described herein relate, generally, to decoupling capacitors and, in particular, to reducing the inductance associated with decoupling capacitors mounted to printed circuit boards.

BACKGROUND

A decoupling capacitor may be used as a low-impedance source of current to minimize supply voltage fluctuations caused by rapid switching of the active devices. One parameter affecting the performance of decoupling capacitors in high speed digital systems is the parasitic inductance associated with the current loop formed by the multilayer capacitor's internal electrodes and their connection to the board's power planes. The greater the inductance the slower the speed with which the system can operate. This loop inductance is a function of several variables including, for example, capacitor size, capacitor terminal configuration, capacitor bottom cover layer thickness, vertical distance from power planes to board surface, via count, via diameter, via separation, horizontal offset of vias from device pad, and etch configuration of the surface layer.

The inductance of a two-terminal capacitor can generally be minimized by locating the vias that connect to the power planes as close as possible to one another, but it is still generally on the order of one nanohenry. A need, therefore, exists for a technique for further minimizing the connection inductance associated with decoupling capacitors.

BRIEF SUMMARY

In general, embodiments described herein provide, among other things, a capacitor designed to significantly reduce or substantially eliminate the traditional via-loop area that contributes to connection inductance. In particular, embodiments provide a capacitor having a stem that is designed to be inserted into a single, large-diameter via hole drilled in a printed circuit board, wherein the stem may have conductive rings for making the positive and negative connections to the printed circuit board power distribution planes. According to one embodiment, inside the stem of the capacitor, current (or at least a portion of the current) may be carried to the main body of the capacitor through low-inductance plates that are interleaved to maximize their own mutual inductance and, therefore, minimize the connection inductance. Alternatively, the capacitor may include a coaxial stem that forms a coaxial transmission line with the anode and cathode terminals forming the inner and outer conductors. The capacitor of embodiments described herein may have considerably less connection inductance than traditional capacitors that are mounted on the surface of a printed circuit board and connect to the power distribution planes of the circuit board through vias.

According to one aspect, a capacitor is provided, wherein the capacitor may include a capacitive stem configured to extend into a printed circuit board and to establish a connection with two or more power distribution planes associated with the printed circuit board. In one embodiment, the capacitive stem may include two or more interleaved low-inductance plates. These plates may extend either vertically across or horizontally through the capacitive stem. In an alternative embodiment, the capacitive stem may include a coaxial stem configured to form a transmission line with the two or more power distribution planes.

In one embodiment, the capacitor may further include a surface-mounted capacitive element electrically connected to the capacitive stem. The surface-mounted capacitive element may be configured to sit on a surface of the printed circuit board. Alternatively, the surface-mounted capacitive element may be configured to extend into the printed circuit board, such that the entire capacitor is embedded within the printed circuit board.

In another embodiment, in order to establish a connection with the two or more power distribution planes associated with the printed circuit board, the capacitive stem may further include two or more metals bands for establishing a connection with the corresponding two or more power distribution planes. In one embodiment, the metal bands may extend at least partially around the outside of the capacitive stem. Alternatively, they may extend at least partially along the length of the capacitive stem. In yet another embodiment, they may extend horizontally through the capacitive stem. In one embodiment, the capacitive stem may include exactly two metal strips that extend horizontally through the capacitive stem, wherein the metal strings are orthogonal with respect to one another.

BRIEF DESCRIPTION OF THE SEVERAL VIEWS OF THE DRAWING(S)

Having thus described embodiments of the invention in general terms, reference will now be made to the accompanying drawings, which are not necessarily drawn to scale and which depict only the metallic parts of a capacitive-stemmed capacitor of embodiments described herein, and wherein:

Figure 6A:
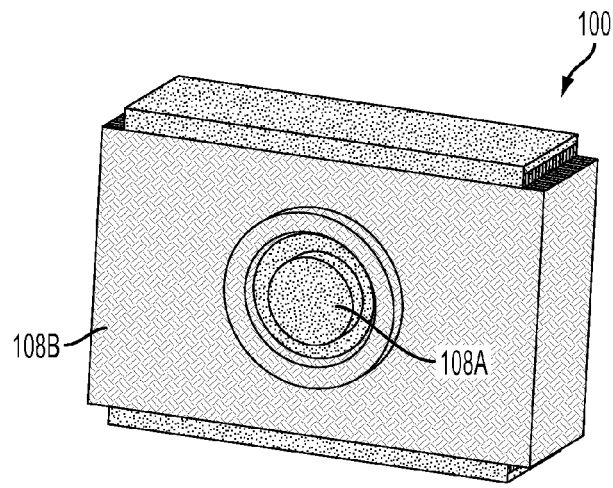
Figure 6B:
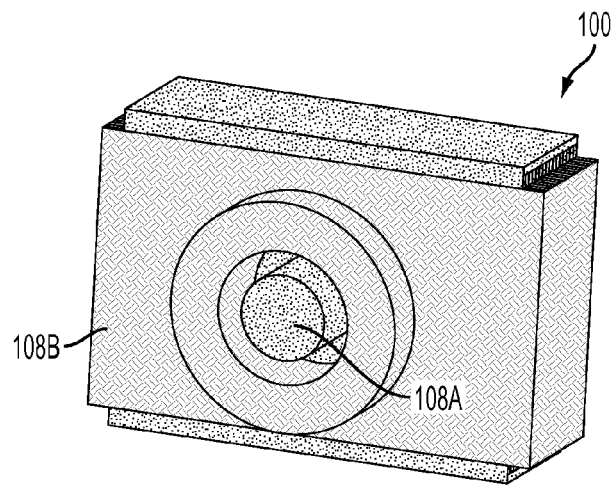
Figure 7:
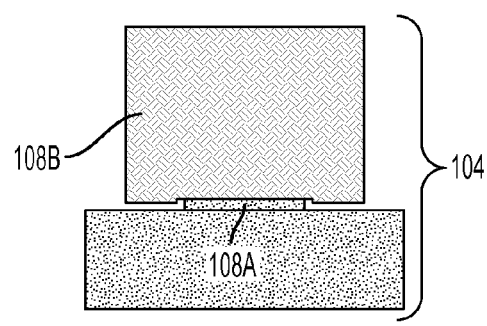
Figure 8A:
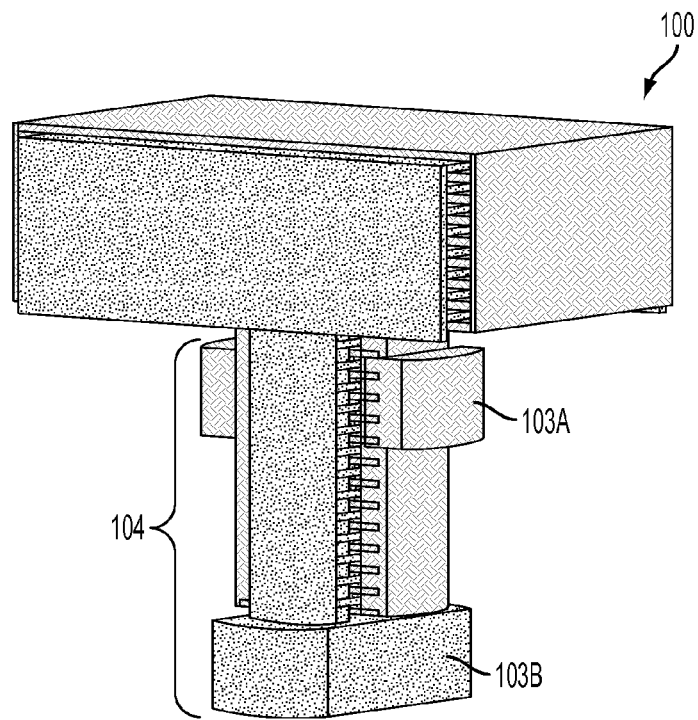
Figure 8B:
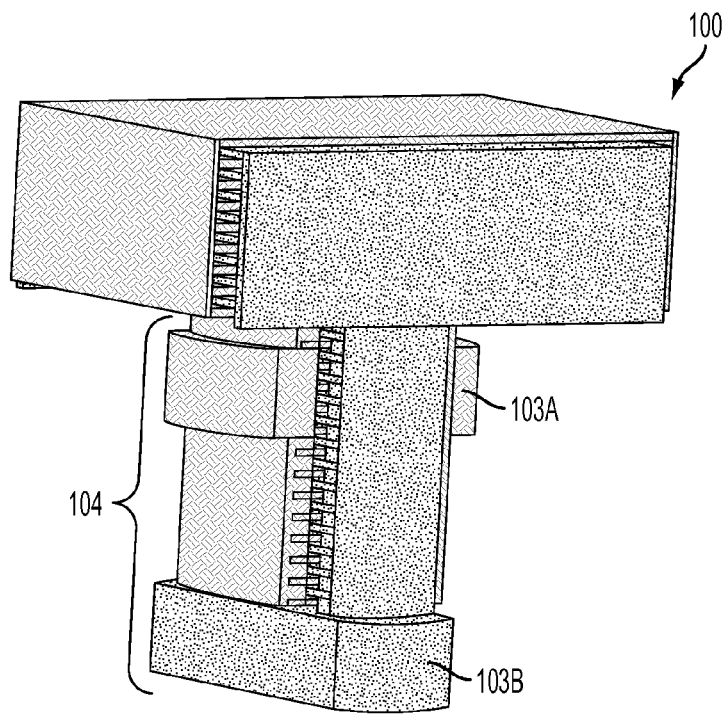
Figure 8C:
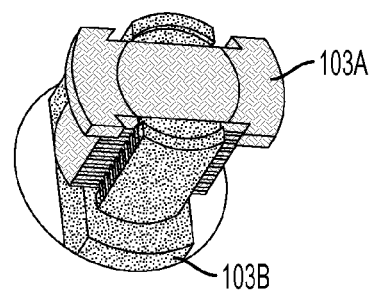
Figure 9:
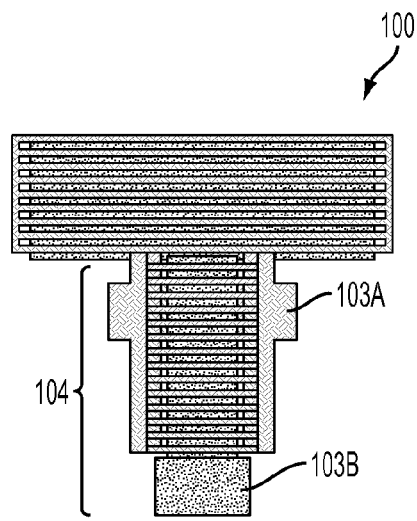
Figure 10:
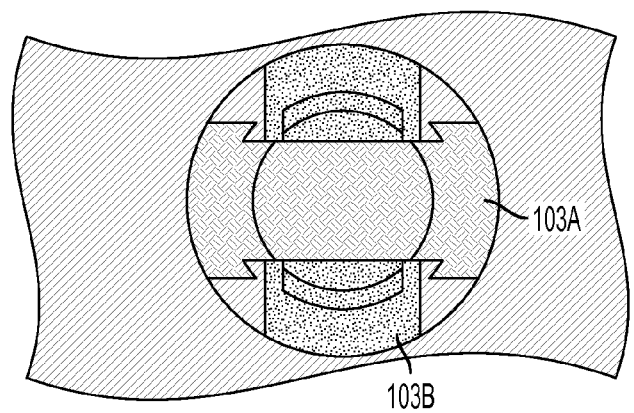
Figure 11A:
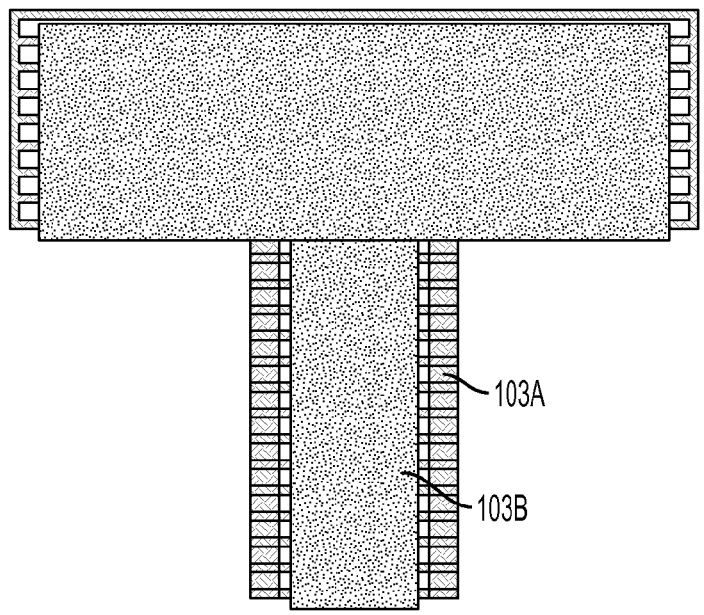
Figure 11B:
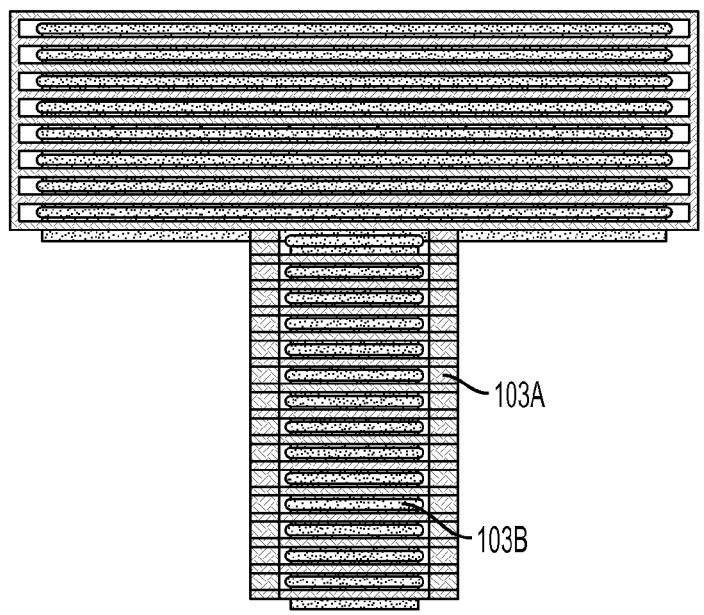
Figure 12:
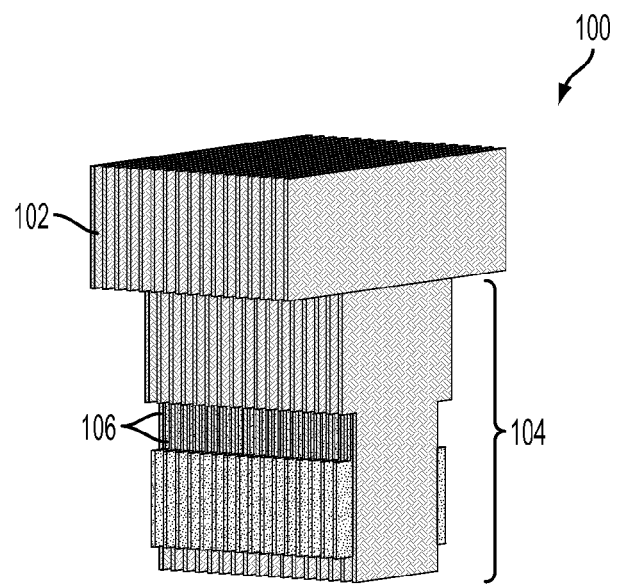
Figure 13A:
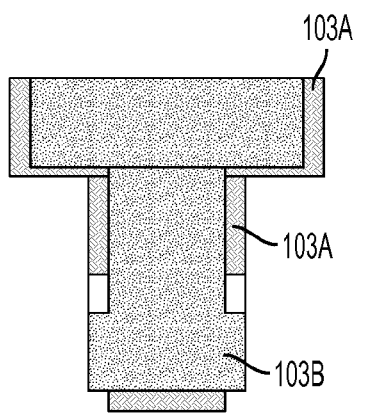
Figure 13B:
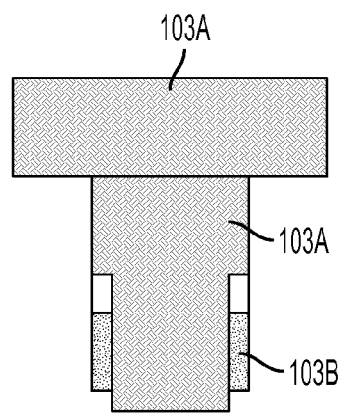

FIGS. 6A & 6B provide horizontal cross-sections of one embodiment of the capacitive-stemmed capacitor having a coaxial stem;

FIG. 7 illustrates a coaxial stem of one embodiment of the capacitive-stemmed capacitor;

FIGS. 8A-8C illustrate another embodiment of the capacitive-stemmed capacitor having horizontal power distribution strips;

FIGS. 9 & 10 illustrate a vertical and a horizontal cross-section, respectively, of a capacitive-stemmed capacitor having horizontal power distribution strips in accordance with an embodiment of the present invention;

FIGS. 11A & 11B illustrate a side view and vertical cross section, respectively, of a capacitive-stemmed capacitor having power distribution bands that extend the full length of the capacitive stem in accordance with an embodiment of the present invention;

FIG. 12 illustrates yet another embodiment of the capacitive-stemmed capacitor having a rectangular capacitive stem; and FIGS. 13A & 13B illustrate vertical cross-sections of one embodiment of the capacitive-stemmed capacitor having a rectangular capacitive stem.

DETAILED DESCRIPTION

Embodiments of the stemmed-capacitor now will be described more fully hereinafter with reference to the accompanying drawings, in which some, but not all embodiments of the inventions are shown. Indeed, embodiments of the invention may be embodied in many different forms and should not be construed as limited to the embodiments set forth herein; rather, these embodiments are provided so that this disclosure will satisfy applicable legal requirements. Like numbers refer to like elements throughout.

Figure 1:
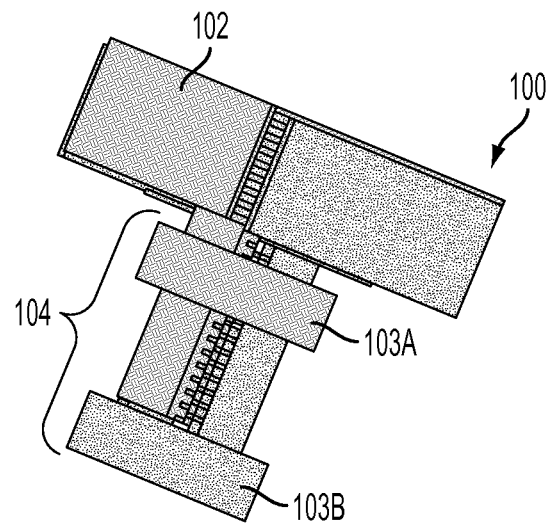
FIG. 1 illustrates one embodiment of a capacitive-stemmed capacitor.

Referring to FIG. 1, one embodiment of a capacitive-stemmed capacitor 100 is provided. As shown, the capacitive-stemmed capacitor 100 of one embodiment can include a surface-mounted capacitive element 102 that is responsible for a majority of the capacitance required for good low-frequency performance. However, instead of having individual vias for connecting to the ground and power planes of a printed circuit board, in order to substantially reduce or eliminate the amount of loop inductance associated with the capacitor, the capacitive-stemmed capacitor 100 of embodiments described herein can include a capacitive stem 104 that can be designed to be inserted into a single, large-diameter via hole drilled into the printed circuit board. According to one embodiment, at least some of the capacitance associated with the capacitive-stemmed capacitor 100 can be extended into this capacitive stem 104 using one or more low-inductance plates or coaxial transmission lines (discussed below).

As shown, the capacitive stem 104 can include power distribution bands 103A and 103B for establishing a connection with the ground and power planes of the printed circuit board (shown in FIGS. 2A and 2B, discussed below). According to one embodiment, these bands, which may be made of metal, or similar conductive material, may extend around the full circumference of the capacitive stem 104, as shown. Alternatively, they may extend only partially around or through the capacitive stem 104 (as shown in FIGS. 8A-10, discussed below).

Figure 2A:
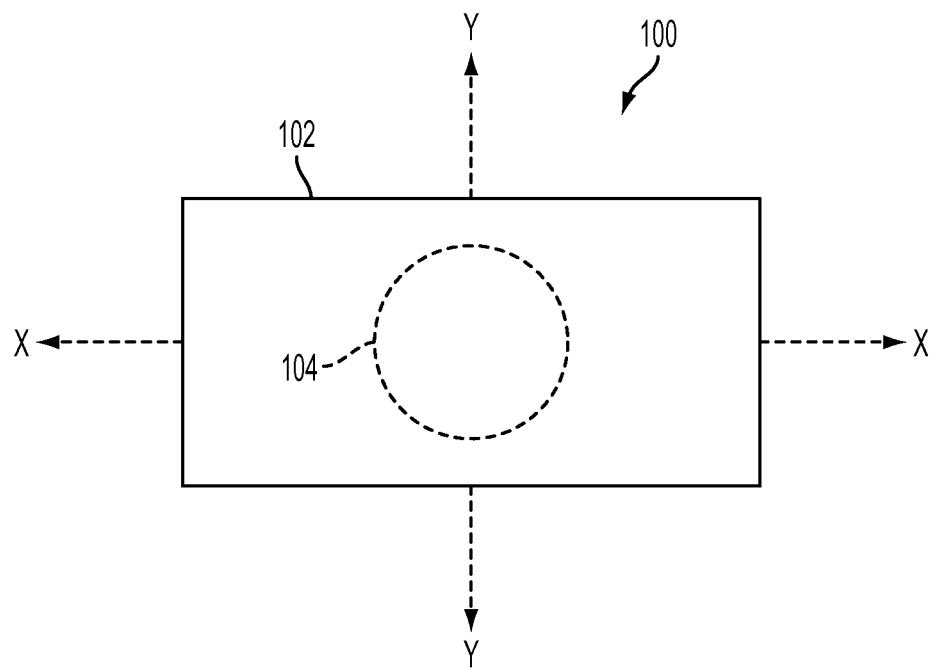
FIG. 2A is a top view of one embodiment of the capacitive-stemmed capacitor.
Figure 2B:
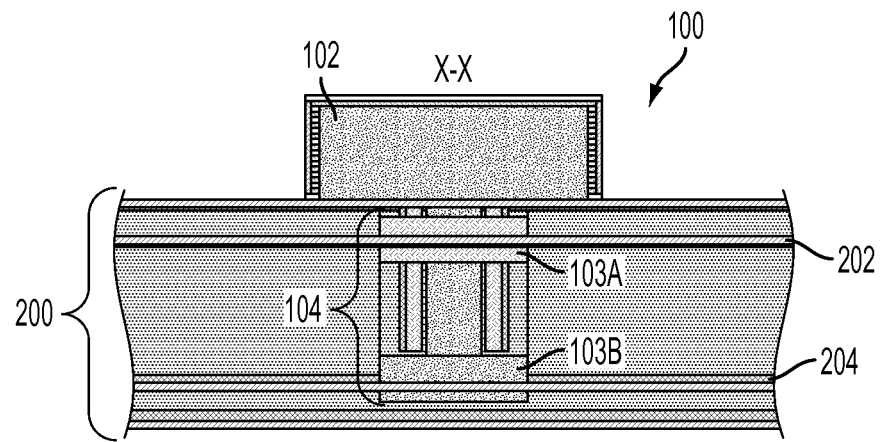
FIGS. 2B & 2C illustrate one embodiment of the capacitive-stemmed capacitor interacting with a printed circuit board in accordance with embodiments described herein.
Figure 2C:
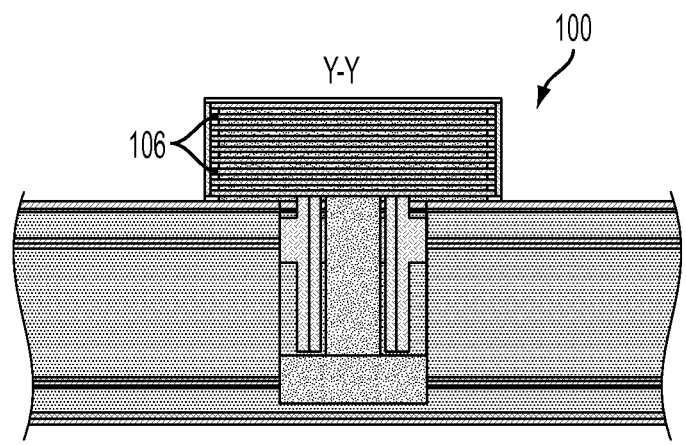

Referring now to FIGS. 2A-2C, a top view of the capacitive-stemmed capacitor 100 of one embodiment is shown in FIG. 2A, while FIGS. 2B and 2C illustrate vertical cross-sections of the capacitive-stemmed capacitor 100 of one embodiment, cut along a line extending from x-x and y-y, respectively. As shown in FIGS. 2B and 2C, the surface-mounted capacitive element 102 can be configured to sit on top of or adjacent to the surface of a printed circuit board 200. Alternatively, while not shown, according to one embodiment, the entire capacitive-stemmed capacitor 100 may be embedded within the printed circuit board 200, thus preserving space on the surface of the board 200.

As further shown in FIGS. 2A and 2B, the capacitive stem 104 can be inserted into a single via hole of the printed circuit board 200, and can include power distribution bands 103A and 103B for connecting to the ground and power planes 202 and 204, respectively, of the printed circuit board 200. In addition to the foregoing, as shown in FIG. 2B, the surface-mounted capacitive element 102 may include a plurality of low-inductance plates 106 for establishing capacitance.

Figure 3A:
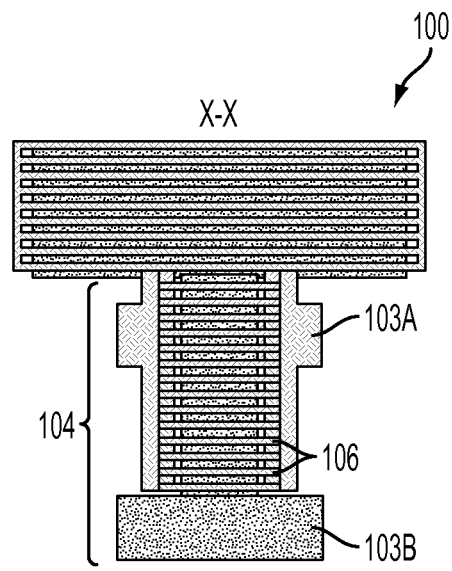
FIGS. 3A & 3B illustrate vertical cross-sections of one embodiment of the capacitive-stemmed capacitor having capacitive plates.
Figure 3B:
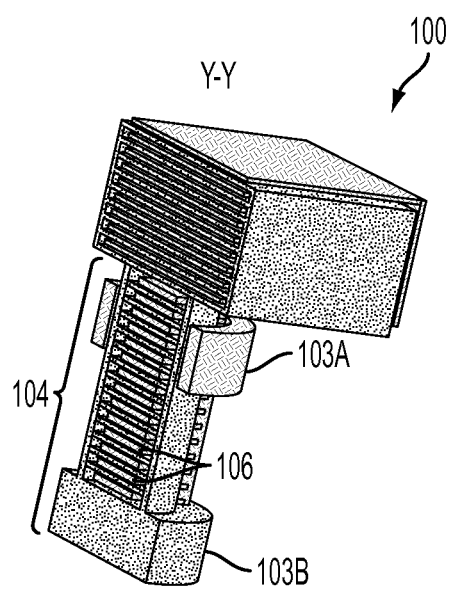
Figure 4A:
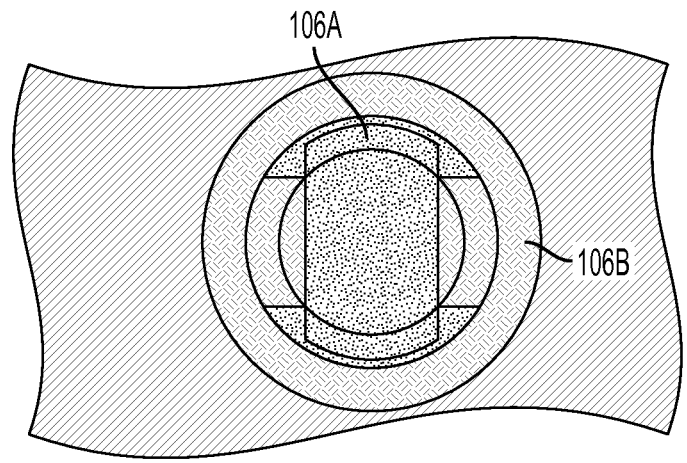
FIGS. 4A & 4B illustrate horizontal cross-sections of the capacitive stem of one embodiment of the capacitive-stemmed capacitor having capacitive plates.
Figure 4B:
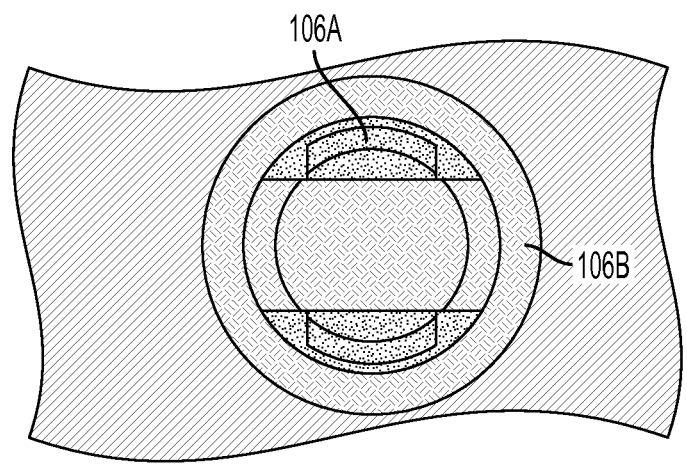
Figure 5A:
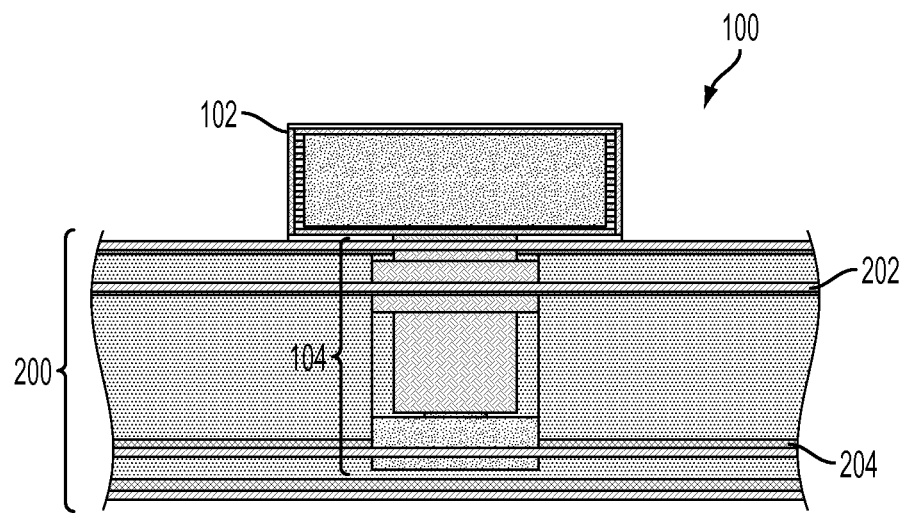
FIGS. 5A & 5B illustrate another embodiment of the capacitive-stemmed capacitor having a coaxial stem.
Figure 5B:
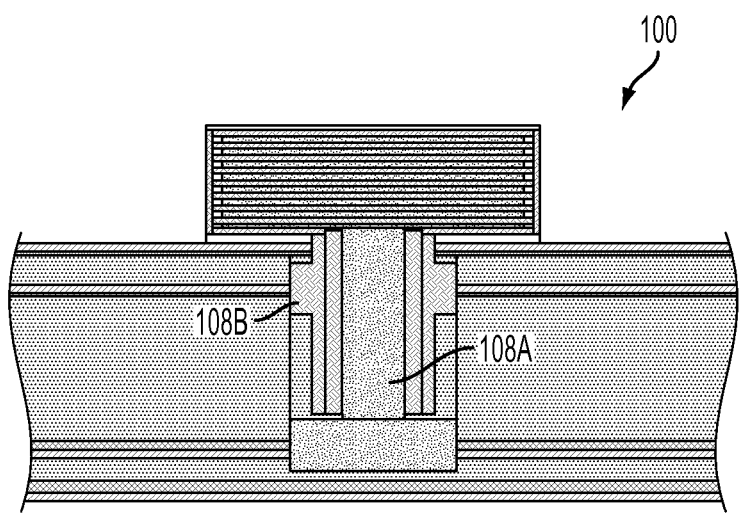

According to one embodiment shown in FIGS. 3A and 3B, which illustrate vertical cross-sections of the capacitive-stemmed capacitor 100 of one embodiment, these low-inductance plates 106 may be further extended into the capacitive stem 104. In particular, according to one embodiment, inside the capacitive stem 104 of the capacitor 100, current (or at least a portion of the current) may be carried to the surface-mounted capacitive element 102 of the capacitor 100 through a plurality of low-inductance plates 106 that can be interleaved to maximize their own mutual inductance and, therefore, minimize the connection inductance. FIGS. 4A and 4B, which provide alternative vertical cross-sections of the capacitive stem 104, also illustrate the low-inductance plates of one embodiment. In particular, FIG. 4A illustrates one slice of the capacitive stem 104, wherein the anode 106A, or a positively charged low-inductance plate can be seen. In contrast, FIG. 4B illustrates another slice of the capacitive stem 104 taken from a different location, wherein the cathode 106B, or a negatively charged low-inductance plate, can be seen. In FIGS. 4A and 4B, the anode 106A constitutes the inner conductor of the capacitive stem 104, while the cathode 106B constitutes the outer conductor. However, as one of ordinary skill in the art will recognize, embodiments of the capacitive-stemmed capacitor 100 are not limited to this particular architecture. For example, the cathode 106B may constitute the inner conductor of the capacitive stem 104, while the anode 106A constitutes the outer conductor, without departing from the spirit and scope of embodiments described herein.

Referring now to FIGS. 5A-7, another embodiment of the capacitive-stemmed capacitor 100 will now be described. In particular, as shown in FIG. 5B, which illustrates a vertical cross-section of this embodiment of the capacitive-stemmed capacitor 100, instead of using low-inductance plates to carry current from the capacitive stem 104 to the surface-mounted capacitive element 102 of the capacitive-stemmed capacitor 100, the capacitive-stemmed capacitor 100 of this embodiment can include a coaxial stem that forms a coaxial transmission line with the power (anode) and ground (cathode) terminals forming the inner and outer conductors of the capacitor 100. As above, while FIG. 5B illustrates the anode 108A, or positively-charged transmission line, as the inner conductor, while showing the cathode 108B, or negatively-charged transmission line, as the outer conductor, the opposite may likewise be true without departing from the spirit and scope of embodiments of the capacitive-stemmed capacitor 100 described herein.

FIGS. 6A and 6B illustrate horizontal cross-sections of this embodiment of the capacitive-stemmed capacitor 100 at or near the location where the capacitive stem 104 joins the surface-mounted capacitive element 102. Finally, FIG. 7 provides another perspective of the capacitive stem 104 having coaxial transmission lines, instead of low-inductance plates.

As mentioned above, according to the embodiment shown in FIGS. 1-3B, the power distribution bands 103A and 103B, which serve to make a connection between the capacitive stem 104 and the power and ground planes 202 and 204 of the printed circuit board 200, may extend around the full circumference of the capacitive stem 104. Alternatively, according to another embodiment, these power distribution bands 103A and 103B may extend only partially around the capacitive stem 104. In yet another embodiment, shown in FIGS. 8A-10, the power distribution bands 103A and 103B can include horizontal strips of metal, or other appropriate conductive material, that extend horizontally through the capacitive stem 104. FIGS. 8A-8C provide different three-dimensional views of such a capacitive-stemmed capacitor 100 having power distribution bands 103A and 103B that extend horizontally through the capacitive stem 104. Similarly, FIGS. 9 and 10 illustrate vertical and horizontal cross-sections, respectively, of this embodiment of the capacitive-stemmed capacitor 100. As shown in FIG. 10, according to one embodiment, the cathode and anode distribution bands 103A and 103B may be orthogonal, or perpendicular, to one another.

According to yet another embodiment shown in FIGS. 11A and B, the vertical height of the power distribution bands 103A and 103B may be extended to the full length of the capacitive stem 104 to allow the capacitive-stemmed capacitor 100 to be used on printed circuit boards with varying spacing between the power distribution planes 202 and 204.

While FIG. 9 illustrates a capacitive-stemmed capacitor 100 having low-inductance plates 106 extending through the capacitive stem 104, as one of ordinary skill in the art will recognize in light of this disclosure, the capacitive stem 104 may likewise include coaxial transmission lines 108A and 108B, discussed above. In addition, while FIGS. 8A-10 illustrates power distribution bands 103A and 103B of generally the same length and width, as one of ordinary skill in the art will recognize, embodiments of the capacitive-stemmed capacitor 100 are not limited to this particular configuration. In contrast, the power distribution bands 103A and 103B may be of different length and/or width without departing from the spirit and scope of embodiments described herein.

Use of metal, or similar material, strips extending horizontally through the capacitive stem 104, rather than bands extending at least partially around the circumference of the capacitive stem 104 may eliminate, or substantially reduce, the need for specific vertical positioning of the power distribution planes 202 and 204 of the printed circuit board 200, as well as facilitate easy soldering, since vertical shearing of solder likely cannot short the connection. However, a capacitive-stemmed capacitor having these metal strips may not be able to be rotated arbitrarily, since the power and ground planes 202 and 204 of the printed circuit board 200 may be designed to make correct connections only when the capacitive-stemmed capacitor 100 is oriented correctly.

While the foregoing figures and description assume that the number of power distribution bands 103A and 103B associated with the capacitive stem 104 is only two, as one of ordinary skill in the art will recognize in light of this disclosure, the number of connection faces associated with the capacitive stem 104 may be greater than two in order to facilitate more than two power distribution planes 202 and 204 of the printed circuit board 200. These connection faces may be staggered vertically (i.e., permitting 360-degree connections to the planes) or horizontally (i.e., making the exact vertical position of the capacitor 100 relative to the planes less than critical and reducing the possibility that vertical shearing of the solder can short the connection).

In addition, while the foregoing figures and description have assumed that the capacitive stem 104 is circular in shape, as one of ordinary skill in the art will recognize in light of this disclosure, embodiments of the capacitive-stemmed capacitor 100 are not so limited. In particular, any shape may be used for the capacitive stem 104 including, for example, a rectangle, as shown in FIGS. 12-13B. In particular, FIG. 12 provides a three-dimensional view of a capacitive-stemmed capacitor 100 having a rectangular shaped capacitive stem 104, while FIGS. 13A and 13B provide different vertical cross-sections of this embodiment of the capacitive-stemmed capacitor 100.

According to embodiments described herein, the rectangular-shaped capacitive stem 104, like the circular capacitive stem 104, may include low-inductance plates 106, or a coaxial stem. In addition, if low-inductance plates 106 are included, these plates 106 may be either vertical (as shown in FIGS. 12-13B), or horizontal, as was the case in FIGS. 3A-4B.

Many modifications and other embodiments of the inventions set forth herein will come to mind to one skilled in the art to which these embodiments of the invention pertain having the benefit of the teachings presented in the foregoing descriptions and the associated drawings. Therefore, it is to be understood that the embodiments of the invention are not to be limited to the specific embodiments disclosed and that modifications and other embodiments are intended to be included within the scope of the appended claims. Moreover, although the foregoing descriptions and the associated drawings describe exemplary embodiments in the context of certain exemplary combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

That which is claimed:

1. A capacitor comprising:
    a capacitive stem configured to extend into a printed circuit board and to establish a connection with two or more power distribution planes associated with the printed circuit board, wherein in order to establish a connection with the two or more power distribution planes the capacitive stem comprises at least one of,
    (1) two or more metal bands extending at least partially around the outside of the capacitive stem for establishing a connection with the corresponding two or more power distribution planes,
    (2) two or more vertical bands extending at least partially along the length of the capacitive stem for establishing a connection with the corresponding two or more power distribution planes, or
    (3) two or more metal strips extending horizontally through the capacitive stem for establishing a connection with the corresponding two or more power distribution planes.

2. The capacitor of claim 1, wherein the capacitive stem further comprises:
    two or more interleaved low-inductance plates.

3. The capacitor of claim 2, wherein the two or more interleaved low-inductance plates extend vertically across the capacitive stem.

4. The capacitor of claim 2, wherein the two or more interleaved low-inductance plates extend horizontally through the capacitive stem.

5. The capacitor of claim 1, wherein the capacitive stem further comprises:
    a coaxial stem configured to form a transmission line with the two or more power distribution planes.

6. The capacitor of claim 1 further comprising:
    a surface-mounted capacitive element electrically connected to the capacitive stem.

7. The capacitor of claim 6, wherein the surface-mounted capacitive element is configured to sit on a surface of the printed circuit board.

8. The capacitor of claim 6, wherein the surface-mounted capacitive element is configured to extend into the printed circuit board, such that the capacitor is fully embedded within the printed circuit board.

9. The capacitor of claim 6, wherein the surface-mounted capacitive element further comprises:
    two or more interleaved low-inductance plates.

10. The capacitor of claim 1, wherein the metal strips are orthogonal with respect to one another.

11. The capacitor of claim 1, wherein the capacitive stem is circular.

12. The capacitor of claim 1, wherein the capacitive stem is rectangular.

13. A capacitor comprising:
   a capacitive stem configured to extend into a printed circuit board and to establish a connection with two or more power distribution planes associated with the printed circuit board, said capacitive stem comprising:
   two or more interleaved low-inductance plates; and
   two or more metal bands for establishing a connection with the corresponding two or more power distribution planes; and
   a surface-mounted capacitive element electrically connected to the capacitive stem and configured to sit on a surface of the printed circuit board.

14. The capacitor of claim 13, wherein the two or more interleaved low-inductance plates extend vertically across the capacitive stem.

15. The capacitor of claim 13, wherein the two or more interleaved low-inductance plates extend horizontally through the capacitive stem.

16. The capacitor of claim 13, wherein the two or more metal bands extend at least partially around an outside of the capacitive stem.

17. A capacitor comprising:
   a capacitive stem configured to extend into a printed circuit board and to establish a connection with two or more power distribution planes associated with the printed circuit board, said capacitive stem comprising:
   a coaxial stem configured to form a transmission line with the two or more power distribution planes; and
   two or more metal bands for establishing a connection with the corresponding two or more power distribution planes; and
   a surface-mounted capacitive element electrically connected to the capacitive stem and configured to sit on a surface of the printed circuit board.

\* \* \* \* \*